United States Patent
Wang et al.

(10) Patent No.: US 7,223,619 B2
(45) Date of Patent: May 29, 2007

(54) VCSEL WITH INTEGRATED LENS

(75) Inventors: Tak Kui Wang, Saratoga, CA (US); Frank Z.-Y. Hu, San Jose, CA (US); Annette C. Grot, Cupertino, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 266 days.

(21) Appl. No.: 10/794,252

(22) Filed: Mar. 5, 2004

(65) Prior Publication Data

US 2005/0195882 A1 Sep. 8, 2005

(51) Int. Cl.
*H01L 21/00* (2006.01)

(52) U.S. Cl. ............. 438/26; 438/27; 257/E33.072

(58) Field of Classification Search ............. 438/22, 438/29, 33–34, 106–110, 113, 462
See application file for complete search history.

(56) References Cited

U.S. PATENT DOCUMENTS

| | | | |
|---|---|---|---|
| 6,658,040 B1 | 12/2003 | Hu et al. | |
| 6,670,105 B2 | 12/2003 | Terada et al. | |
| 6,953,990 B2 * | 10/2005 | Gallup et al. | 257/678 |
| 6,955,934 B2 * | 10/2005 | Gallup et al. | 438/27 |
| 6,998,691 B2 * | 2/2006 | Baugh et al. | 257/433 |
| 7,027,694 B2 * | 4/2006 | Wang et al. | 385/52 |
| 2005/0098790 A1 * | 5/2005 | Gallup et al. | 257/100 |
| 2006/0039655 A1 * | 2/2006 | Wilson | 385/79 |

OTHER PUBLICATIONS

David, C., "Fabrication of Stair-case Profiles With High Aspect Ratios For Blazed Diffractive Optical Elements" Micoelectronic Engineering 53 (2000) pp. 677-680.
Gale, Michael T., "Replicated Diffractive Optics and Micro-Optics" Optics & Photonics News (Aug. 2003) pp. 24-29.
Karlsson, M. et al., "Monolithic Integration of Continuous-Relief Diffractive Structures With Vertical-Cavity Surface-Emitting Lasers" IEEE Photonics Technology Letters vol. 15, No. 3, (Mar. 2003) pp. 359-361.

* cited by examiner

*Primary Examiner*—Savitri Mulpuri

(57) ABSTRACT

A wafer-level device fabrication process forms standing structures around emitting areas of multiple VCSELs. The standing structures can be shaped to hold ball lenses or other optical elements for respective VCSELs or can include platforms on which optical elements are formed. Ball lenses that are attached to the standing structures either during chip-level or wafer-level processes fit into the standing structures and are automatically aligned. Wafer level fabrication of optical elements can align the optical elements with accuracies associated with photolithographic processes. The optical elements can be formed using a molding or replication process, a printing method, or surface tension during a reflow of lithographically formed regions.

21 Claims, 6 Drawing Sheets

VCSEL WITH INTEGRATED LENS

BACKGROUND

A vertical cavity surface emitting laser (VCSEL) is a semiconductor laser diode that can be fabricated using well-known wafer processing techniques. Conventionally, such techniques fabricate a larger number of VCSELs on a single wafer. The wafer is then sawn, scribed, or otherwise divided into a dice, with each die containing at least one VCSEL and possibly other integrated circuitry that was formed on the wafer. The dice are then packaged for use.

A common use of a VCSEL is in generation of an optical signal for transmission on an optical fiber. In this application, the optical signal from the VCSEL generally enters the optical fiber via an optical coupler or port. For efficient coupling of the optical energy from the VCSEL into the optical fiber, the VCSEL and the optical fiber must be aligned so that the beam intensity profile of the VCSEL lies primarily on the core of the optical fiber. An optical system between the VCSEL and the optical fiber can be used to improve the coupling efficiency and increase alignment tolerance of the VCSEL and the optical fiber. In particular, a common optical system for such use includes one or multiple optical elements that focuses and/or manipulate the profile of the light beam on the end of the optical fiber. In the following discussion, lens refers to any optical element that can manipulate the profile of a light beam and can be a refractive or diffractive element.

Forming a lens directly on the emitting area of the VCSEL generally fails to achieve adequate optical performance because it is difficult to make a lens with a short enough focal length to properly focus or collimate the beam. Accordingly, air gaps or separations between the lens and light emitting area of the VCSEL are normally required for processing the optical signal. Further, lens material on an active region of the VCSEL can compromise the reliability of the VCSEL by introducing interface stress. The lens material on the front facet of a VCSEL may also change the reflectivity of the front mirror of the VCSEL, requiring a redesign of the VCSEL.

Making the lenses part of the package or assembly containing the VCSEL allows use of a longer focal length lens element with an air gap. However, a drawback of optical packages or assemblies employing a lens between the VCSEL and the fiber is the need to align the VCSEL, the lens, and the optical fiber. Aligning a lens to a VCSEL on a die generally requires precision instruments and can be a time consuming and therefore expensive process. Structures and methods that reduce the cost associated with combining a VCSEL with a lens are thus sought.

SUMMARY

In accordance with an aspect of the invention, a wafer-level device fabrication process forms standing structures on multiple VCSEL on a wafer. The standing structures can be shaped to hold ball lenses or other optical elements for respective VCSELs and can be aligned to the precision achieved during wafer processing. For example, a lithographic process can form the standing structure of a polymer material such as photoresist, an insulating material, a semiconductor material, or a metal. Ball lenses can be set on the standing structures during either the chip level packaging process or a wafer level process. An adhesive can be applied to a standing structure before or after the ball lens is set on the standing structure. The adhesive can then be cured.

In accordance with another aspect of the invention, a wafer-level device fabrication process forms structures that include lenses on the wafer. Wafer level processes thus precisely align the lenses with laser diodes. One wafer-level process attaches a lens wafer to standing structures or standoffs on a laser wafer. Refractive or diffractive lenses can be formed on the lens wafer before or after bonding of the lens wafer to the laser wafer. Another wafer level process forms standoff structures overlying emitting areas of laser diodes and forms refractive or diffractive lenses on the standoff structures. Air gaps can be provided under the lenses using a sacrificial layer. In particular, the sacrificial layer can be formed over the emitting areas of the laser diodes and then removed after the lenses are formed to create gaps between the laser diodes and the overlying lenses. The lenses can be formed on a laser wafer using a variety of techniques including but not limited to a molding or replication process, printing methods, and surface tension during liquefaction of lithographically formed regions.

One specific embodiment of the invention is a device including: a die containing a laser diode; a standing structure attached to the die and surrounding an emitting area through which a beam from the laser diode emerges from the die; and a ball lens attached to the standing structure and residing at least partially within a cavity defined by the standing structure.

Another embodiment of the invention is a device including: a substrate containing a laser diode; a standing structure attached to the substrate; and a lens formed on the standing structure and overlying an emitting area through which a beam from the laser diode emerges from the substrate. The substrate can be either a wafer before division into separate dice, or a die after separation.

Still another embodiment of the invention is a process for fabricating a laser diode with a lens. The process includes: fabricating a plurality of laser diodes on a wafer; forming standing structures on the wafer, wherein the standing structures define a plurality of cavities centered on respective emitting areas of the laser diodes; and attaching lenses to the standing structures. Each of the lenses resides at least partially in a corresponding one of the cavities and is thus self aligned to a corresponding laser diode.

A process in accordance with yet another embodiment of the invention includes: fabricating a plurality of laser diodes on a wafer; forming standing structures on the wafer; and fabricating lenses overlying the standing structures.

BRIEF DESCRIPTION OF THE DRAWINGS

Use of the same reference symbols in different figures indicates similar or identical items.

DETAILED DESCRIPTION

In accordance with an aspect of the present invention, wafer level processes for fabrication of semiconductor laser diodes can create structures for alignment of optical elements. The optical elements can be attached to or formed over individual laser diodes at the wafer level or at the die level.

Figure 1:
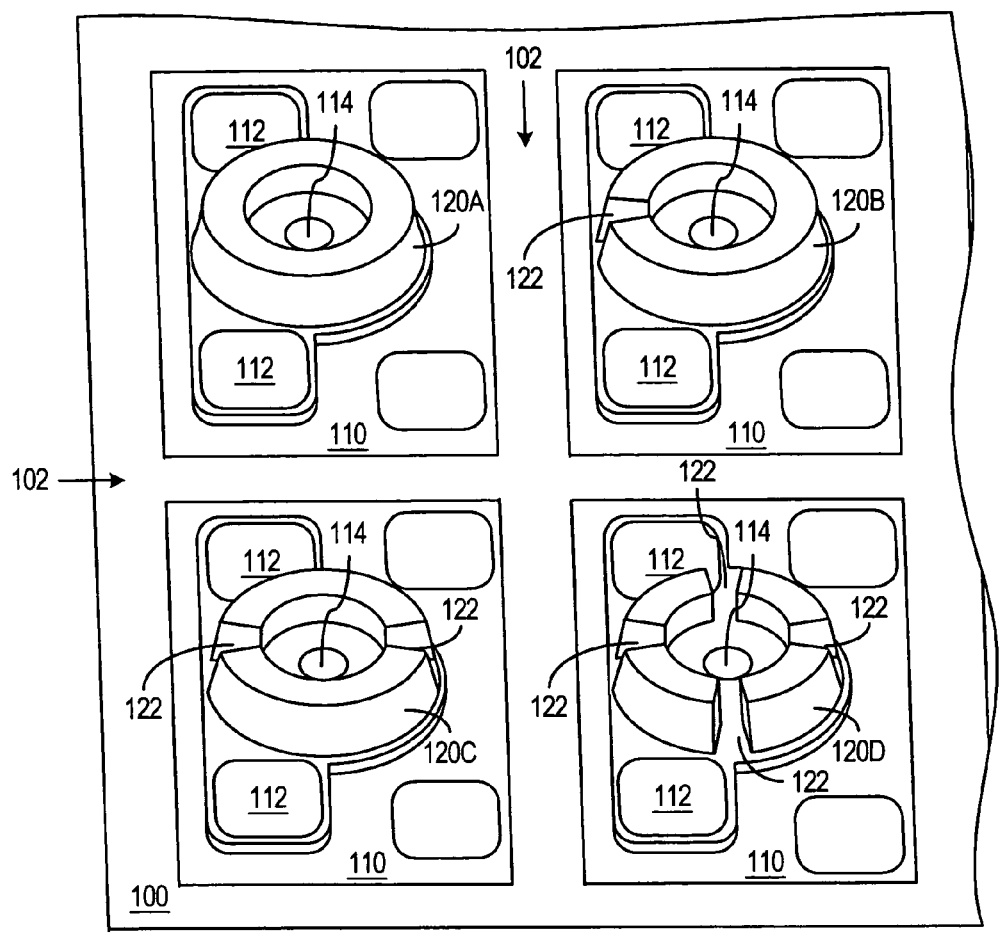
FIG. 1 shows part of a wafer in accordance with an embodiment of the invention containing multiple semiconductor lasers with stand structures for lenses.

FIG. 1 illustrates an embodiment of the invention in which multiple laser diodes 110 have been formed in and on a wafer 100. In an exemplary embodiment of the invention, each laser diode 110 is a vertical cavity surface emitting laser (VCSEL) that can be formed using well-known semiconductor processing techniques. For example, U.S. Pat. No. 6,658,040, entitled "High Speed VCSEL", describes one specific example of a suitable laser diode, but more generally, aspects of the invention can be applied to any laser diode architecture that emits a light beam from a surface of a wafer.

Each laser diode 110 includes bond pads 112 for electrical connections and a light emitting area 114 through which a light beam emerges. Scribe lanes 102 separate laser diodes 110 and permit sawing, scribing, or other processing that cuts wafer 100 into individual dice without damaging the laser diodes 110.

Standing structures 120A, 120B, 120C, and 120D (generically referred to herein as structures 120) surround respective light emitting areas 114 of each of the laser diodes 110 for which a lens will be provided. Standing structures 120A, 120B, 120C, and 120D differ from each other in FIG. 1 to illustrate some of the suitable geometries for structures 120, but more typically, all of the structures 120 on a wafer 100 would be the same for a process fabricating substantially identical devices.

Standing structure 120A in FIG. 1 is ring-shaped and centered on the emitting area 114 of the corresponding laser diode 110. The inner diameter, width, and height of standing structure 120A will generally depend on the size and optical properties of the lenses to be attached over laser diodes 110 and may also depend on the material used in standing structure 120A and on the techniques and structures that form electrical connections to laser diodes 110. In an exemplary embodiment of the invention where the lens is a ball lens having a diameter of 300 μm, standing structure 120A can be made of a polymer material such as polyimide, cyclotene, an epoxy, or a photoresist and has an inner diameter of about 60 to 80 μm, a width of about 20 to 40 μm, and a height or thickness of about 20 to 60 μm. One example of a suitable polymer material is Durimide 7520 manufactured by Arch Chemical. Another possible polymer material is SU-8 by MicroChem Corp. Both polymer materials can be dispensed by spinning and patterned by lithographic methods.

Standing structures 120B, 120C, and 120D are similar to standing structure 120A but have one or more openings 122 formed through the respective ring walls. Openings 122 can help control air/adhesive flow in embodiments where an adhesive attaches lenses to structures 120. In particular, one attachment process coats an optically transparent adhesive on a structure 120 before setting a ball lens on the structure 120. For best optical performance, non-uniformities such as irregular air-adhesive interfaces should be excluded from optical path of the laser beam. Accordingly, a cavity formed in structure 120 between the ball lens and laser diode 110 is preferably filled with air or with transparent adhesive, and gas bubbles in the adhesive should be avoided where the adhesive is in the optical path. Openings 122 facilitate filling the cavity in structure 120 with adhesive without trapping air or gas bubbles. An adhesive such as silicone, which does not introduce significant interface stress, is preferred in embodiments where the adhesive filling the cavity is directly on an active surface of a laser diode 110.

In an alternative attachment process that provides an air gap between laser 110 and the lens, openings 122 prevent thermal expansion of trapped gas from disrupting the attachment of the lens. The size and number of openings 122 in structures 120 can be selected as best suited for the particular attachment process employed.

The illustrated standing structures 120 as described above are primarily ring shaped, and when a ball lens is set on such structure 120, the seating of the ball lens provides automatic alignment of the ball lens to the underlying laser diode 110. Other geometries for a standing structure 120 could also provide automatic alignment when used with a ball lens or another optical element that is shaped to fit in an opening that the standing structure 120 creates. For example, three or more posts of equal height that are equal distance from the light emitting area 114 of a laser diode 110 can hold a ball lens in proper alignment, and such posts can have a variety of shapes, including but not limited to the sections of rings shown in FIG. 1.

As noted above, standing structures 120 can be formed from a variety of materials, including polymers, metals, and insulators. In an embodiment of the invention using a polymer such as a photoresist, the fabrication of standing structures 120 begins spinning a layer of photoresist such as SU-8 onto a wafer on which laser diodes 110 have been fabricated. The thickness of the photoresist layer is selected according to the desired height of standing structures 120 and would be about 20 to 60 μm for an exemplary embodiment of the invention. A conventional photolithographic process can then expose the photoresist layer to a light pattern of the appropriate wavelength and then develop the photoresist to leave photoresist regions that form standing structures 120. The photoresist regions can be baked or otherwise hardened to improve the durability of standing structure 120 if desired.

Alternative embodiments for standing structures 120 can contain other materials other than polymers. In particular, a metal standing structure 120 can be formed using an electroplating process. For such a process, a seed coating including adhesion layer of chromium and a top layer of gold can be deposited on wafer 100. A photoresist mold layer then formed on the seed layer includes openings that expose the seed layer in the areas corresponding to standing structure 120. An electroplating process can then plate the exposed areas with a metal such as nickel to a desired thickness, e.g., between 20 and 60 µm. The photoresist layer and unplated portions of the seed layer are then removed to leave metal standing structures 120.

Figure 2:
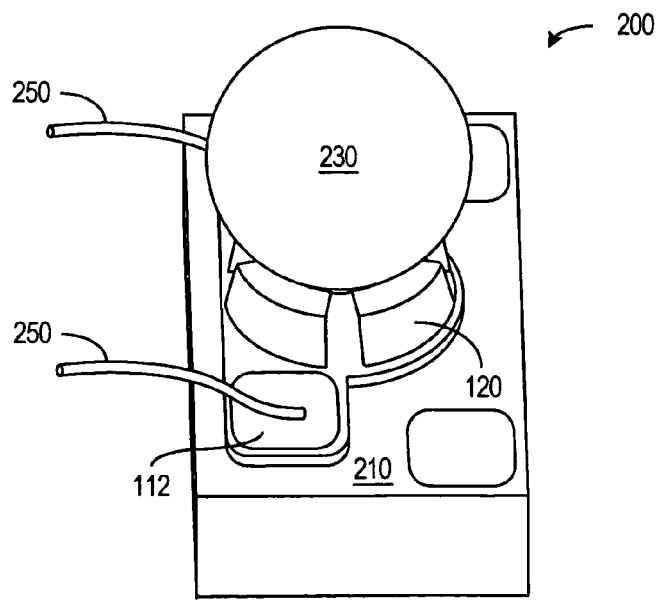
FIG. 2 shows a perspective view of a semiconductor laser chip with an attached ball lens in accordance with an embodiment of the invention.

FIG. 2 shows a device 200 with a ball lens 230 attached in accordance with an embodiment of the invention. Device 200 includes a die 210 corresponding to one of the laser diodes 110 on wafer 100 of FIG. 1. Ball lens 230 can be a sphere of an optical material such as plastic, glass, or sapphire having a diameter and refractive index, preferably selected to collimate or focus an output beam from the underlying laser diode. Wires 250 for electrical connections can be attached to bond pads 112 using conventional wire bonding techniques before the setting of ball lens 230. However, a low profile or short loop wire bond is preferred to prevent bond wires 250 from interfering with the placement of ball lens 230. For example, in an embodiment in which ball lens 230 has a diameter of about 300 µm and standing structure 120 has a height of about 38.5 µm and an inner diameter of about 65 µm, bond wires 250 preferably extend less than about 150 µm above the surface of die 210 under ball lens 230.

Ball lens 230 rests on standing structure 120, and can be glued in place with an adhesive such as silicone. As mentioned above, an optically transparent adhesive can fill the cavity between ball lens 230 and the underlying laser diode. Alternatively, adhesive (not shown) can surround ball lens 230 and/or cap standing structure 120 leaving an air gap between ball lens 230 and the underlying laser diode.

Another alternative attachment process coats wafer 100 first with polyimide and then with a positive resist such as Microposit S1822 manufactured by Shipley. The polyimide layer can thus be non-photoimageable. A lithographic process then patterns the photoresist layer to form a mask and patterns the polyimide using the photoresist mask. The resulting standing structure 120 includes a polyimide base capped with photoresist. Ball lens 230 is then placed into the standing structure 120 either before or after wafer 100 is cut into dice, and the photoresist remaining atop the polyimide is heated to reflow and permanently retain or attach ball lens 230 in standing structure 120.

The above-described processes for attaching ball lenses 230 to corresponding standing structures 120 can generally be performed at either the wafer level or the die level. When adhesive is applied, a die level attachment process after wire bonding may be preferred to prevent excess adhesive from interfering with the wire bonding. When reflow of photoresist attaches the lenses, a wafer level process may be preferred unless the attached lenses will interfere with the die separation or wire bonding processes.

The lithographic process that defines the shape and location of standing structures 120 aligns the standing structures 120 to laser diodes 110, and the fit of ball lens 230 in the cavity in standing structure 120 aligns ball lens 230 to standing structure 120. Further, the spherical symmetry of a ball lens 230 avoids the need to control the orientation of ball lens 230. The attachment process is thus relatively simple and inexpensive and provides a high precision alignment (e.g., to with a tolerance less than about 4 µm).

Figure 3:
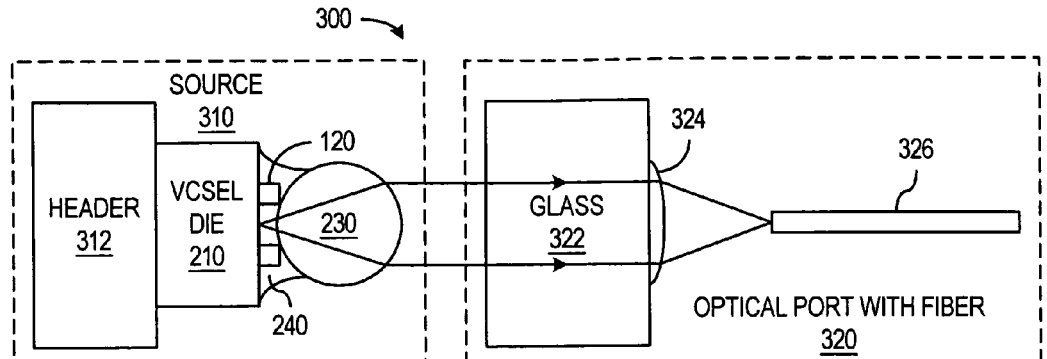
FIG. 3 illustrates a system in accordance with an embodiment of the invention that collimates or adjusts the beam profile of an optical signal to increase alignment tolerances for coupling the optical signal into a fiber optic port.

FIG. 3 illustrates a system 300 in which an optical signal from an optical source 310 in accordance with an embodiment of the invention is coupled into an optical fiber 326 associated with an optical port 320. System 300 may, for example, be part of a communication system for transmitting data on a fiber optic network or part of a CD or DVD player or drive.

Optical system 310 includes a VCSEL die 210 attached to a header 312. Header 312 can be a printed circuit board or a mechanical support structure. Bond wires or other structures (not shown) can electrically connect VCSEL die 210 to header 310 or other circuitry (not shown). An adhesive 240 attaches a ball lens 230 on a standing structure 120 that surrounds the emitting area of a laser diode on die 210. The output beam from the laser diode generally diverges at an angle that is characteristic of the laser diode. Ball lens 230 decreases the divergence of the output beam and preferably has optical properties (e.g., a focal length) such that the output beam becomes collimated. The separation of ball lens 230 and the light emitting area of the laser diode is controlled to effect either a collimated beam or a suitable focusing distance.

In the illustrated embodiment, optical port 320 includes optical elements such as a glass plate 322 on which a converging lens 324 is formed, e.g., by reflow of a polymer region, inkjet printing, or molding. Converging lens 324 focuses the collimated beam from ball lens 323 onto the end of optical fiber 316. Alternatively, glass 322 and lens 324 can be eliminated, and ball lens 230 can focus the light beam onto fiber 326.

The reduced (or ideally eliminated) divergence from source 310 relaxes the alignment tolerances in system 300. In particular, efficient coupling of the optical energy from source 310 can be achieved for a broader range of separations between source 310 and port 320.

In accordance with another aspect of the invention, lenses can be formed overlying a laser diode rather than being separately formed and attached to the laser wafer. Formation of the lenses overlying the wafer laser can use a variety of lens forming techniques such as a molding or replication process, a printing method, and surface tension during a reflow of lithographically formed regions. Such lenses generally work best if air gaps or other separations are between the laser diodes and the respective lenses.

Figure 4A:
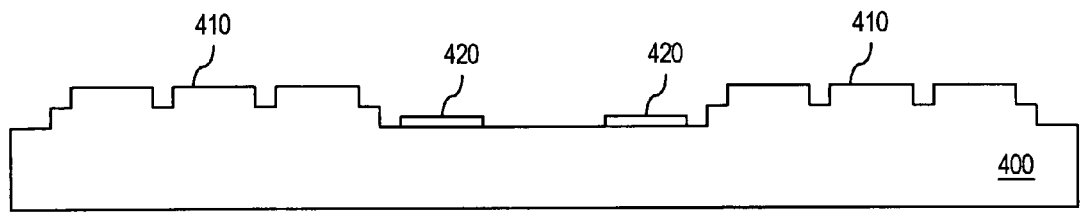
FIGS. 4A, 4B, 4C, and 4D illustrate a process in accordance with an embodiment of the invention that forms a lens array on a lens wafer that is attached to standing structures on a wafer containing laser diodes.
Figure 4B:
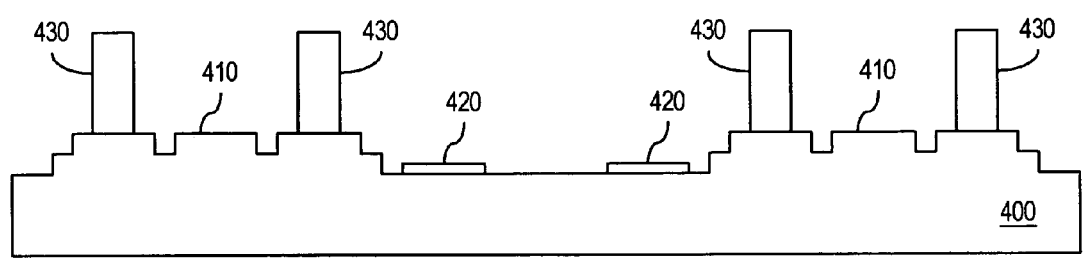
Figure 4C:
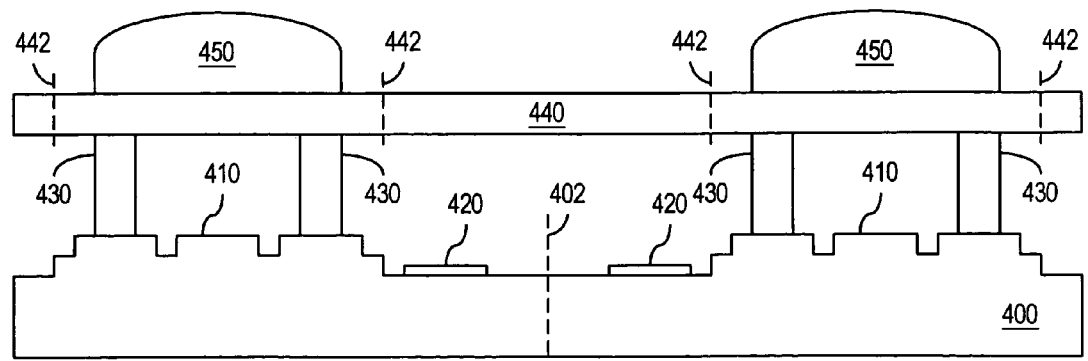
Figure 4D:
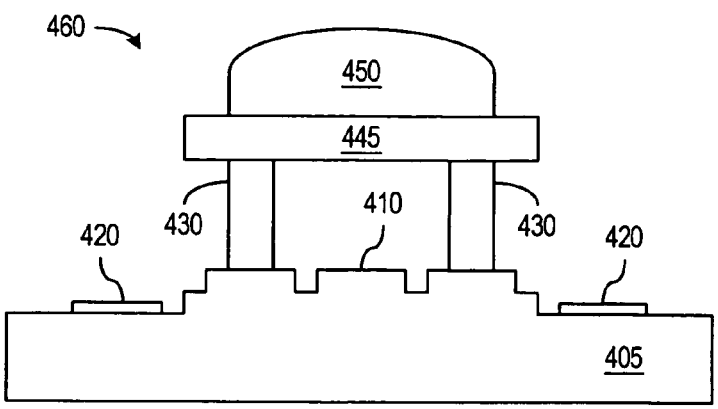

FIGS. 4A, 4B, and 4C illustrate a fabrication process for a device 460 illustrated in FIG. 4D. Device 460 includes a lens 450 overlying an emitting area of a laser diode 410 in a semiconductor die 405. Standoffs 430 and a transparent plate 445 support lens 450 and provide a separation between laser diode 410 and lens 450. The separation includes an air gap that is between laser diode 410 and plate 445 and therefore avoids reliability problems that may be associated with a material interface at the front facet of laser diode 410. The separation also permits use of a lens 450 having a more readily achieved focal length and allows space for subsequent wire bonding to pads 420.

A manufacturing process for device 460 can begin with fabrication of a wafer 400 containing multiple laser diodes 410 as illustrated in FIG. 4A. In an exemplary embodiment of the invention, each laser diode 410 is a VCSEL that has bonding pads 420 adjacent to an emitting area of the VCSEL. Wafer 400 can be fabricated using wafer processing techniques that are well known for manufacturing VCSELs.

A photolithographic process can form standoffs 430 on wafer 400 as shown in FIG. 4B. In the exemplary embodiment, standoffs 430 are made of a photoimageable polyimide or photoresist materials such as SU-8, but other materials such as metals, semiconductors, or insulators could alternatively be used. To form standoffs, the desired material can be deposited on wafer 400 to a thickness selected according to the desired height of standoffs 430, e.g., in the range of 10 to 100 µm. After exposure to a desired light pattern, and developing, a standoff 430 surrounds each laser diode 410 for which a lens 450 will be provided. Standoffs 430 may have any of the configurations of standing structures 120 of FIG. 1 or may simply be posts of any shape that are near laser diodes 410.

A lens wafer 440 is bonded to the tops of standoffs 430 as shown in FIG. 4C. Lens wafer 440 is preferably a thin wafer (e.g., about 0.5 mm to 1.5 mm thick) of a material such as glass or quartz that is transparent to the wavelength of light emitted from laser diodes 410. Lens wafer 440 can be bonded to standoffs 430 by spin coating a transparent adhesive material onto the lens wafer surface.

Lenses 450 are formed on lens wafer 440 either before or after bonding lens wafer 440 to standoffs 430. If lenses 450 are formed on lens wafer 440 before wafer bonding, an aligned wafer bonding process is required to align lenses 450 on lens wafer 440 to the respective laser diodes 410 on laser wafer 400.

A variety of techniques can be used to fabricate lenses 450 on lens wafer 440. One technique forms lenses 450 by lithographically patterning a photoresist layer to create regions of photoresist overlying respective laser diodes 410 and heating the photoresist regions until the regions melt sufficiently that surface tension creates a curved lens surface. Alternatively, printing process (e.g., ink jet printing) or a molding process (e.g., as described by M. Gale, "Replicated Diffractive Optics and Micro-Optics", Optics & Photonics News, August 2003) could form lenses 450 on lens wafer 440. Diffractive lenses can also be formed by methods described by C. David "Fabrication Of Stair-Case Profiles With High Aspect Ratios For Blazed Diffractive Optical Elements" Microelectronic Engineering 53 (2000) 677-680 and U.S. Pat. No. 6,670,105.

Standoffs 430 in addition to creating air gaps between lasers 410 and respective lenses 450 also provides space that permits sawing lens wafer 440 along scribe lanes 442 and sawing laser wafer 410 along scribe lanes 402. Bonding pads 420 on the individual devices 460 thus separated as illustrated in FIG. 4D are accessible for wire bonding.

Figure 5A:
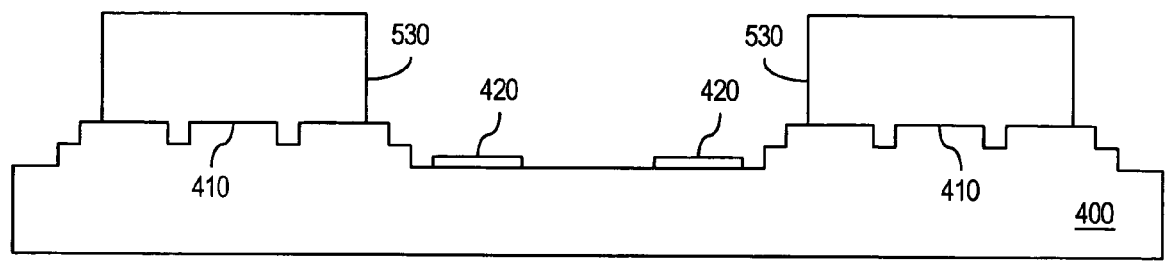
FIGS. 5A, 5B, and 5C illustrate a wafer level process in accordance with an embodiment of the invention that forms lenses on standoffs overlying laser diodes.
Figure 5B:
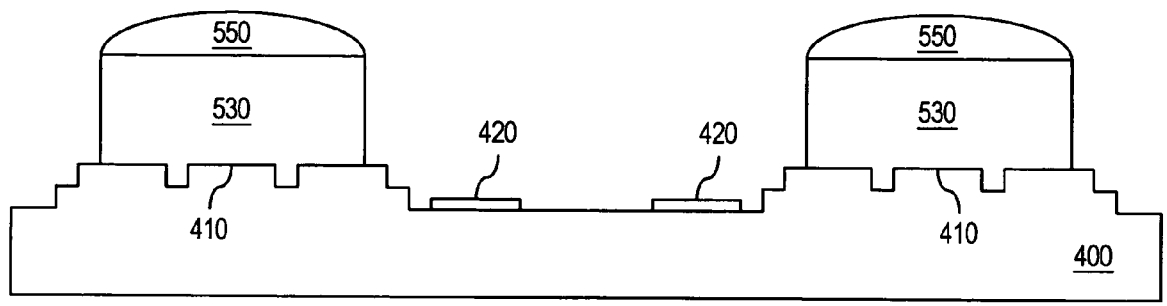
Figure 5C:
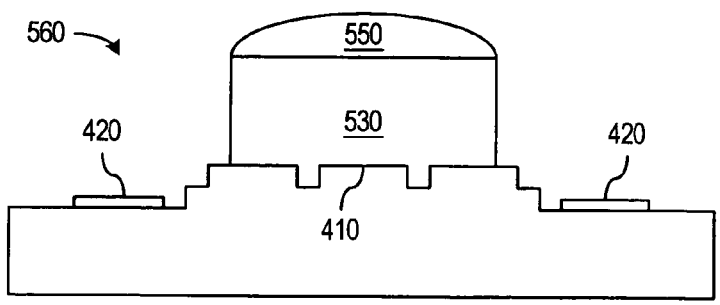

FIGS. 5A, 5B and 5C illustrate a process for fabrication of a device 560 (FIG. 5C) in accordance with another embodiment of the invention. This fabrication process begins with the laser wafer 400 of FIG. 4A and forms standoffs 530 directly on respective laser diodes 410. A conventional photolithographic process can form standoffs 530 of an optically transparent material such as polyimide or SU-8 having a thickness sufficient to provide a desired separation between laser diodes 410 and lenses 550. A lens fabrication process forms refractive or diffractive lenses 550 directly on standoffs 530 as shown in FIG. 5B so that bonding of a lens wafer is not required. In an exemplary embodiment, a non-contact inkjet printing method can to be used to form lenses 550. In this method, a liquid UV curable material can be jetted onto the top of the standing structure 530. The liquid will flow across the top of the standing structure 530 but is held in by surface tension at the edge of the standing structure 530. Surface tension will also create a spherical surface for the UV curable material. Curing of the liquid material forms a solid refractive lens 550. After lens formation, sawing of wafer 400 separates individual devices 560 such as illustrated in FIG. 5C.

Standoffs 530 of FIGS. 5A to 5C differ from standoffs 430 of FIG. 4B in that standoffs 530 overly the front facets of laser diodes 410 and have an area that is at least as large as the lenses. Accordingly, device 560 does not have air gaps over the front facets of laser diodes 410. Concerns associated with interface stress at the front facets of the laser diodes can be addressed through choice of a standoff material that minimize the stress and/or use of a lower operating temperature for the laser diodes 410.

Figure 6A:
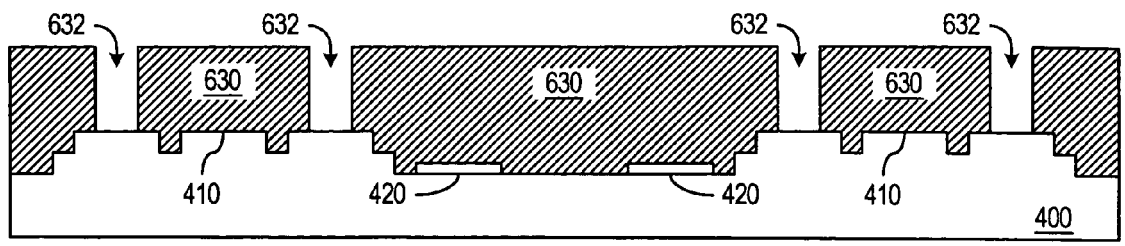
FIGS. 6A, 6B, 6C, and 6D illustrate a wafer level process in accordance with an embodiment of the invention that removes a sacrificial layer to create air gaps between a laser wafer and lenses formed by a replication process.

FIGS. 6A to 6D illustrate a fabrication process using a sacrificial layer 630 that can be removed to create air gaps between laser diodes 410 and respective lenses 640. The fabrication process begins as illustrated in FIG. 6A with formation of a patterned sacrificial layer 630 on laser wafer 400 of FIG. 4A. Sacrificial layer 630 can be formed from a photoresist material having a thickness desired for the height of the standoffs and has openings 632 in areas where standoffs are desired.

Figure 6B:
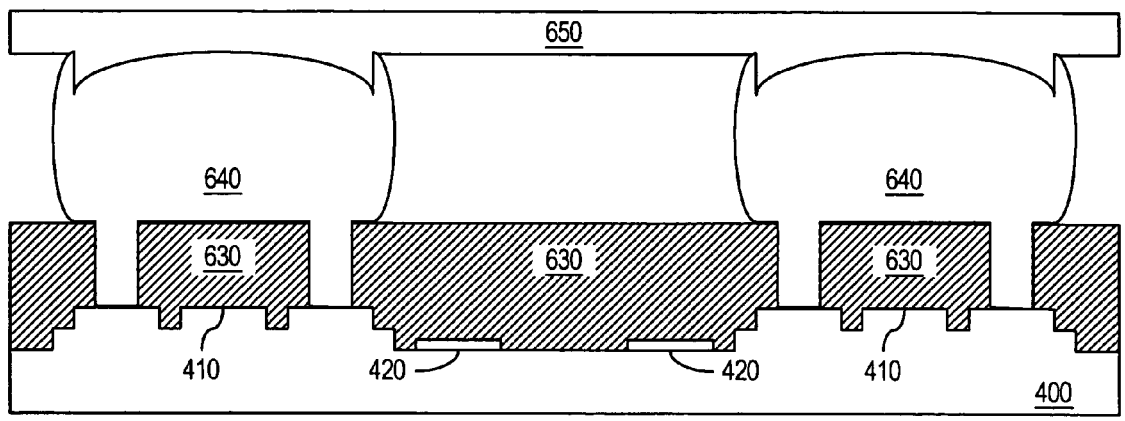

A lens layer 640 of a material such as a UV curable epoxy is deposited to fill openings 632 in sacrificial layer 630 and further to have a thickness above sacrificial layer 630 that is sufficient for a molding process, e.g., about 200 μm thick. The lens layer is patterned as shown in FIG. 6B to create separate regions above respective laser diodes 410 and to expose portions of sacrificial layer 630 above electrical contacts 420 of laser diodes 410. Portions of lens layer 640 that extend into openings 632 will form standoffs for the lenses.

Figure 6C:
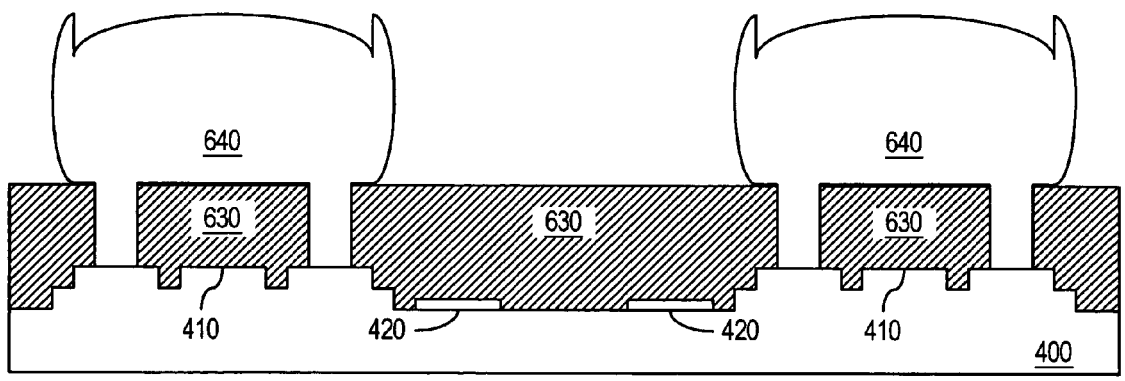

A replication process can then mold the top surface of lens layer 640 as required to form refractive or diffractive lenses. As shown in FIG. 6B, a wafer sized mold 650 can be applied to lens layer 640 to shape lens layer 640 as required to form the desired lens surfaces. Generally, the replication process can employ a variety of techniques to impress the desired contours on lens layer 640. One technique is a hot embossing process that heats mold 650 to a temperature sufficient for deformation of lens layer 640 and then cools the lens layer 640 to retain the embossed shape. Alternatively, mold 650 can be applied when lens layer 640 is in a malleable uncured state, and curing (e.g., using UV curing) hardens lens layer 640 while mold 650 is in place. FIG. 6C shows the structure after removal of mold 650.

Figure 6D:
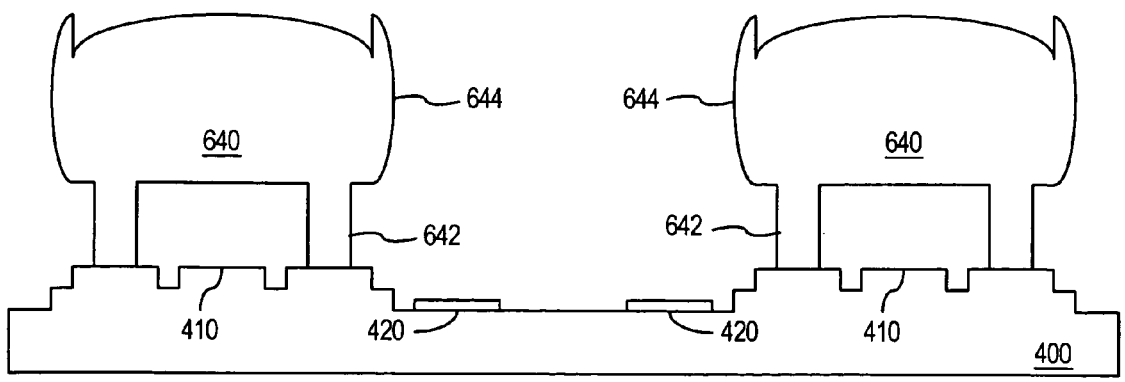

A selective etch can remove sacrificial layer 630 and leave lens layer 640 including standoffs 642 and lens bodies 644 as shown in FIG. 6D. The process of FIGS. 6A to 6D removes sacrificial layer 630 after formation of lens surfaces on lens layer 640, but the order of processing steps could be changed. Standoffs 642, which where formed from the portions of lens layer 640 in openings 632, support lens bodies 644 while providing air gaps between laser diodes 410 and respective lens bodies 644. Conventional sawing or another process can cut laser wafer 400 into individual dice (not shown).

Figure 7A:
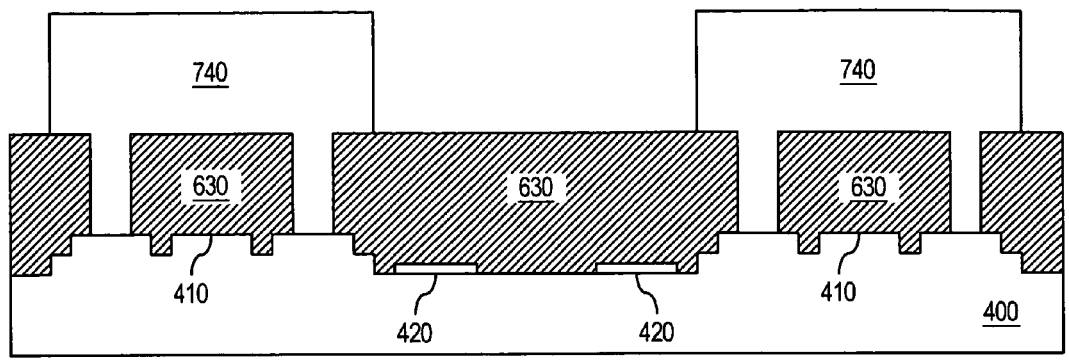
FIGS. 7A, 7B, and 7C illustrate a wafer level process in accordance with an embodiment of the invention that removes a sacrificial layer to create air gaps between a laser wafer and lenses formed by inkjet printing.
Figure 7B:
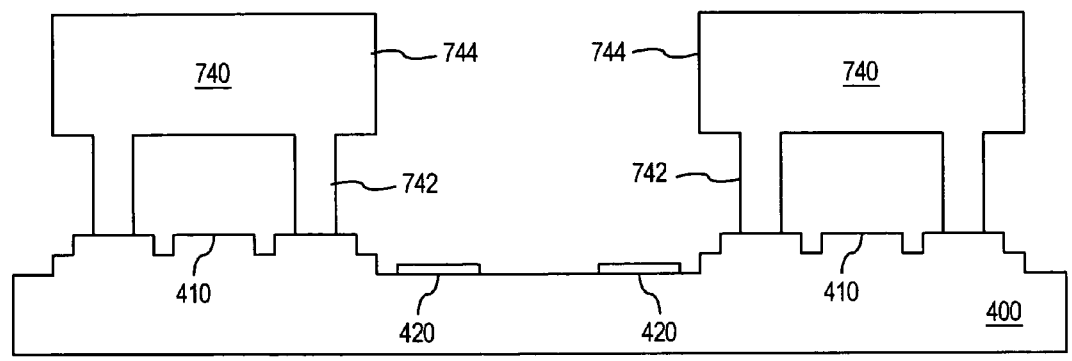
Figure 7C:
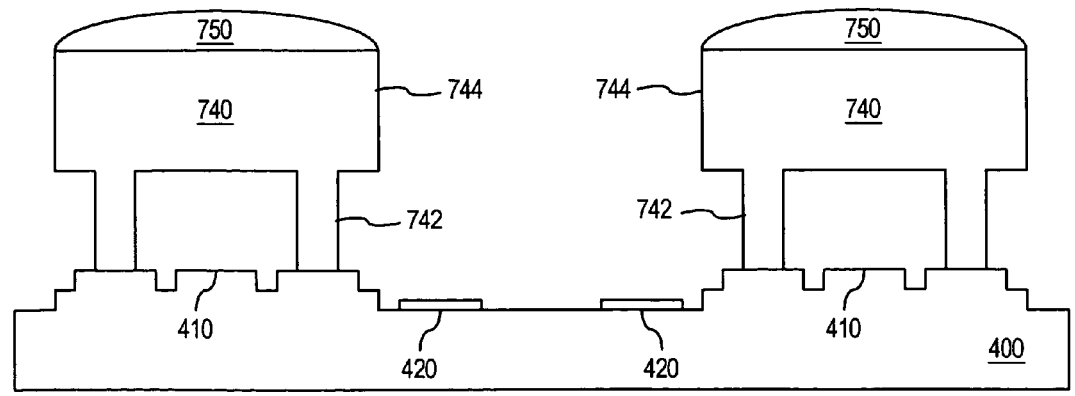

FIGS. 7A to 7C illustrate another process using a sacrificial layer 630 for support during lens fabrication and removal of sacrificial layer 630 to create air gaps. The process of FIGS. 7A to 7C can begin with the structure of FIG. 6A including a laser wafer 400 on which sacrificial layer 630 has been formed as described above. A lens support layer 740 is then deposited to fill openings 632 in sacrificial layer 630 and to extend above sacrificial layer 630 by a desired height. Lens support layer 740 can be made of polyimide, SU-8, or any other material that is optically transparent and permits selective etching to remove sacrificial layer 630 while lens support layer 740 remains substantially intact. As shown in FIG. 7A, lens support layer 740 can be patterned to expose portions of sacrificial layer 630 for subsequent selective etch process that removes sacrificial layer 630. FIG. 7B shows the remaining lens support layer 740, including standoffs 742 and support areas 744, after removal of sacrificial layer 630.

A lens formation process forms lenses 750 on top of lens support layer 740 as shown in FIG. 7C. In an exemplary embodiment of the invention, a printing operation such as inkjet printing deposits lens material on support areas 744 as required to build up lenses 750. Inkjet printing of UV curable material can be performed as described above in regard to the process of FIGS. 5A to 5C. Since the printing process does not apply significant heat or pressure to support areas 744, refractive lenses 750 can be fabricated using this technique after removal of sacrificial layer 630. However, alternative ordering of the processing steps are also possible.

Figure 8A:
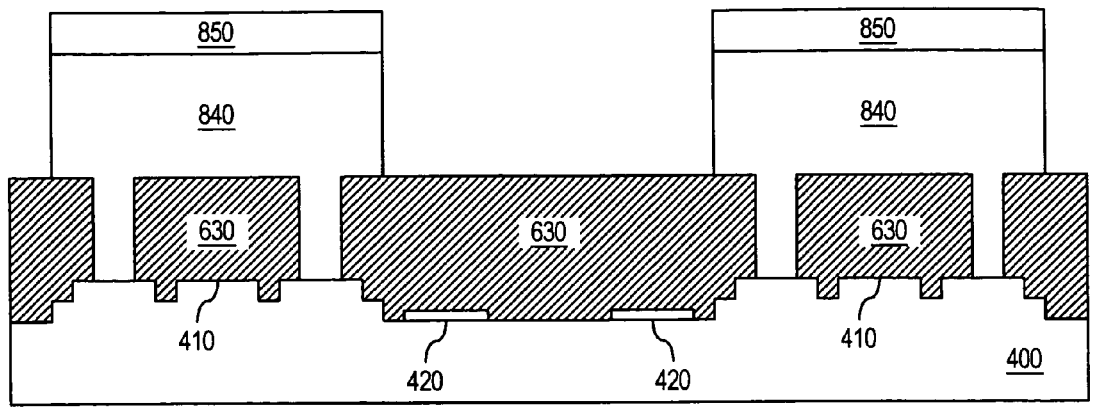
FIGS. 8A, 8B, and 8C illustrate a wafer level process in accordance with an embodiment of the invention that removes a sacrificial layer to create air gaps between a laser wafer and lenses formed by a reflow process.
Figure 8B:
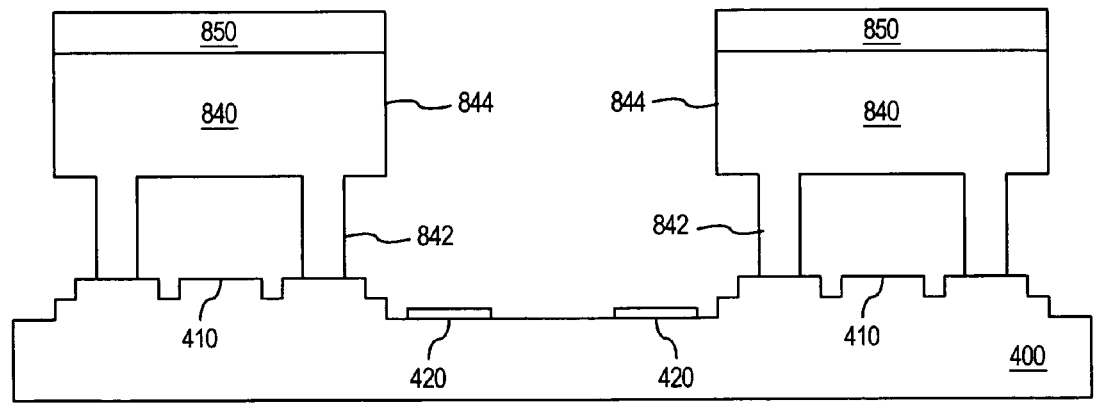
Figure 8C:
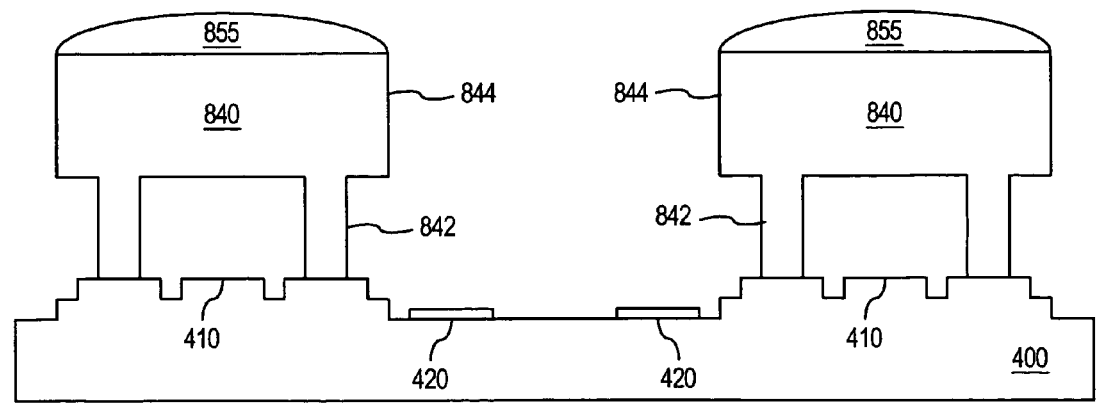

FIGS. 8A to 8C illustrate yet another device fabrication process using a sacrificial layer 630. This embodiment of the invention can begin with fabrication of laser wafer 400 with overlying sacrificial layer 630 as shown in FIG. 6A. A lens support layer 840 of a material such as polyimide or SU-8 is then deposited to fill openings 632 in sacrificial layer 630 and to overlie sacrificial layer 630. As shown in FIG. 8A, lens support layer 840 can be patterned using a photoresist mask 850 to expose portions of sacrificial layer 630. The same process can be used to pattern lens support layer 740 of FIG. 7A, but for the process of FIGS. 8A to 8C, photoresist mask 850 is left on lens support wafer 840 rather than being stripped off after removal of exposed portions of lens support layer 840.

Sacrificial layer 630 is removed as shown in FIG. 8B to leave mask 850 and lens support layer 840 including standoffs 842 and lens support areas 844. The photoresist material that forms mask 850 should differ from the photoresist material that forms sacrificial layer 630 to avoid removal of mask 850 during removal of sacrificial layer 630. One embodiment of the invention uses a negative resist material such as NR9-8000P from Futurex as the sacrificial material 630, and Durimide 100 from Arch Chemical as the standoff material 840. A positive photoresist such as S1822 from Shipley can be used as the mask 850 to pattern and develop standoff material 840. After standoff material 840 is patterned, a negative resist stripper RR4 from Futurex can remove the sacrificial layer 630.

After removal of sacrificial layer 630, lenses 855 can be formed on lens support areas 844 by heating mask 850 to a temperature at which regions of mask 850 liquefy. Surface tension then creates a convex lens contour that remains after mask 850 cools.

Although the invention has been described with reference to particular embodiments, the description is only an example of the invention's application and should not be taken as a limitation. In particular, beam sources manufactured using any of the methods of FIGS. 4A to 4D, FIGS. 5A to 5C, FIGS. 6A to 6D, FIGS. 7A to 7C, or FIGS. 8A to 8C can be employed in place of beam source 310 in FIG. 3 and in higher level systems such as an optical communication system, CD or DVD drives or players, or other systems employing optical signals or laser beams. Various other adaptations and combinations of features of the embodiments disclosed are within the scope of the invention as defined by the following claims.

We claim:

1. A process comprising:
fabricating a plurality of laser diodes on a wafer;
forming standing structures on the wafer by depositing a layer of material and then patterning the layer, wherein the standing structures define a plurality of cavities centered on respective emitting areas of the laser diodes, where in the material is selected from the group consisting of polyimide, epoxy, and cyclotene; and
attaching lenses to the standing structures, wherein each of the lenses resides at least partially in a corresponding one of the cavities.

2. The process of claim 1, wherein each standing structure comprises a wall that is substantially ring-shaped.

3. The process of claim 2, wherein each wall includes one or more openings.

4. The process of claim 1, wherein each of the lenses comprises a ball lens.

5. A process comprising:
fabricating a plurality of laser diodes on a wafer;
forming standing structures on the wafer, wherein the standing structures define a plurality of cavities centered on respective emitting areas of the laser diodes; and
attaching lenses to the standing structures, wherein each of the lenses resides at least partially in a corresponding one of the cavities, wherein attaching the lenses comprises:
applying an adhesive to the standing structures, wherein applying the adhesive filling the cavities; and
setting the lenses on the standing structures.

6. The process of claim 1, wherein attaching the lenses comprises:
setting the lenses on the standing structures; and
heating the standing structures to a temperature at which material in the standing structures adheres to the lenses.

7. The process of claim 1, further comprising cutting the wafer to separate a plurality of dice, each die comprising at least one of the laser diodes and at least one of the standing structures.

8. The process of claim 7, wherein attaching the lenses is performed after cutting of the wafer.

9. A process comprising:
fabricating a plurality of laser diodes on a first wafer;
forming standing structures on the first wafer, wherein each standing structure comprises:
a lens support region overlying an emitting area of a corresponding one of the laser diodes; and
a standoff that supports the lens support region and is on the first wafer adjacent to the emitting area; and
fabricating lenses overlying the standing structures, wherein forming the standing structures comprises:
fabricating the standoff on the first wafer; and attaching a second wafer to top surfaces of the standoffs, wherein the lenses are fabricated on areas of the second wafer corresponding to the support regions.

10. A process comprising:
fabricating a plurality of laser diodes on a first wafer;
forming standing structures on the first wafer, wherein forming the standing structures comprises:
forming a first layer on the first wafer, wherein the first layer comprises a plurality of openings;
depositing a second layer that fills the openings in the first layer and overlies a top surface of the first layer; and
removing the first layer to leave portions of the second layer that form the standing structures; and
fabricating lenses overlying the standing structures.

11. The process of claim 10, wherein each standing structure comprises:
a lens support region overlying an emitting area of a corresponding one of the laser diodes; and
a standoff that supports the lens support region and is on the first wafer adjacent to the emitting area.

12. The process of claim 9, wherein air gaps reside between the laser diodes and the second wafer.

13. The process of claim 9, wherein fabricating the lenses comprises forming the lenses on the lens support area.

14. A process comprising:
fabricating a plurality of laser diodes on a first wafer;
forming standing structures on the first wafer; and
fabricating lenses overlying the standing structures, wherein fabricating the lenses comprises:
depositing a layer of lens material; and
applying a mold to the layer to replicate a surface of the mold on the layer.

15. The process of claim 14, further comprising heating the mold to a temperature that causes the layer to conform to the contours of the mold.

16. The process of claim 14, wherein applying the mold comprises applying the mold to the layer while the layer is in an uncured state, and the process further comprises curing the layer so that the layer retains the surface of the mold.

17. The process of claim 16, wherein curing comprises UV curing.

18. The process of claim 9, wherein fabricating the lenses comprises inkjet printing of a light curable polymer.

19. The process of claim 9, wherein fabricating the lenses comprises:

forming regions of lens material on surfaces overlying emitting areas of the laser diodes; and heating regions to a temperature at which surface tension of the lens material creates a curved surface.

20. The process of claim 1, wherein attaching the lenses to the standing structures comprises placing each lens on a corresponding one of the standing structures, and wherein surfaces of the lenses and the standing structures are matched to fit together and thereby align the lenses respectively with the laser diodes.

21. The process of claim 9, further comprising cutting the first and second wafers to separate a plurality of dice, each die comprising at least one of the laser diodes and at least one of the standing structures.

* * * * *